US006977203B2

(12) United States Patent
Hshieh et al.

(10) Patent No.: US 6,977,203 B2
(45) Date of Patent: Dec. 20, 2005

(54) METHOD OF FORMING NARROW TRENCHES IN SEMICONDUCTOR SUBSTRATES

(75) Inventors: Fwu-Iuan Hshieh, Saratoga, CA (US); Koon Chong So, Fremont, CA (US); John E. Amato, Tracy, CA (US); Brian D. Pratt, Tracy, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/010,162

(22) Filed: Nov. 20, 2001

(65) Prior Publication Data

US 2003/0096479 A1    May 22, 2003

(51) Int. Cl.[7] .................. H01L 21/336; H01L 21/8234; H01L 21/3205; H01L 21/311
(52) U.S. Cl. ...................... 438/268; 438/270; 438/271; 438/272; 438/273; 438/274; 438/589; 438/700
(58) Field of Search ................................ 438/270–275, 438/589, 268, 700

(56) References Cited

U.S. PATENT DOCUMENTS

| 5,023,203 | A |   | 6/1991  | Choi |
| 5,072,266 | A |   | 12/1991 | Bulucea et al. |
| 5,283,201 | A | * | 2/1994  | Tsang et al. ................ 438/138 |
| 5,429,078 | A | * | 7/1995  | Tanigawa et al. ........... 438/270 |
| 5,541,425 | A |   | 7/1996  | Nishihara .................... 257/139 |
| 5,629,246 | A | * | 5/1997  | Iyer ............................. 438/763 |
| 5,817,552 | A | * | 10/1998 | Roesner et al. ............. 438/241 |
| 5,863,707 | A |   | 1/1999  | Lin ............................. 430/313 |
| 5,866,931 | A |   | 2/1999  | Bulucea et al. ............. 257/331 |
| 5,897,343 | A |   | 4/1999  | Mathew et al. ............. 438/133 |
| 5,904,525 | A |   | 5/1999  | Hshieh et al. .............. 438/272 |
| 6,051,468 | A |   | 4/2000  | Hshieh ....................... 438/270 |
| 6,121,089 | A | * | 9/2000  | Zeng et al. ................. 438/268 |
| 6,211,018 | B1| * | 4/2001  | Nam et al. .................. 438/270 |

OTHER PUBLICATIONS

Stanley Wolf, Richard N. Tauber; SIlicon Processing For The VLSI 1986; Lattice Press; vol. 1; pp. 418-420.*

* cited by examiner

*Primary Examiner*—Michael Lebentritt
*Assistant Examiner*—Ron Pompey
(74) *Attorney, Agent, or Firm*—Mayer Fortkort & Williams PC; Stuart H. Mayer, Esq.; Karin L. Williams, Esq.

(57) ABSTRACT

A method of forming a trench within a semiconductor substrate. The method comprises, for example, the following: (a) providing a semiconductor substrate; (b) providing a patterned first CVD-deposited masking material layer having a first aperture over the semiconductor substrate; (c) depositing a second CVD-deposited masking material layer over the first masking material layer; (d) etching the second masking material layer until a second aperture that is narrower than the first aperture is created in the second masking material within the first aperture; and (e) etching the semiconductor substrate through the second aperture such that a trench is formed in the semiconductor substrate. In preferred embodiments, the method of the present invention is used in the formation of trench MOSFET devices.

10 Claims, 6 Drawing Sheets

METHOD OF FORMING NARROW TRENCHES IN SEMICONDUCTOR SUBSTRATES

FIELD OF THE INVENTION

This invention relates to methods of forming narrow trenches in semiconductor substrates.

BACKGROUND OF THE INVENTION

Narrow trenches are commonly desired during fabrication of a wide array of semiconductor devices. Hence, although a specific example concerning the utility of narrow trenches is discussed below in connection with trench MOSFET devices, it is noted that narrow trenches have utility throughout the semiconductor field.

A trench MOSFET (metal-oxide-semiconductor field-effect transistor) is a transistor in which the channel is formed vertically and the gate is formed in a trench extending between the source and drain. The trench, which is lined with a thin insulator layer such as an oxide layer and filled with a conductor such as polysilicon (i.e., polycrystalline silicon), allows less constricted current flow and thereby provides lower values of specific on-resistance. Examples of trench MOSFET transistors are disclosed, for example, in U.S. Pat. Nos. 5,072,266, 5,541,425, and 5,866,931, the disclosures of which are hereby incorporated by reference.

Figure 1:
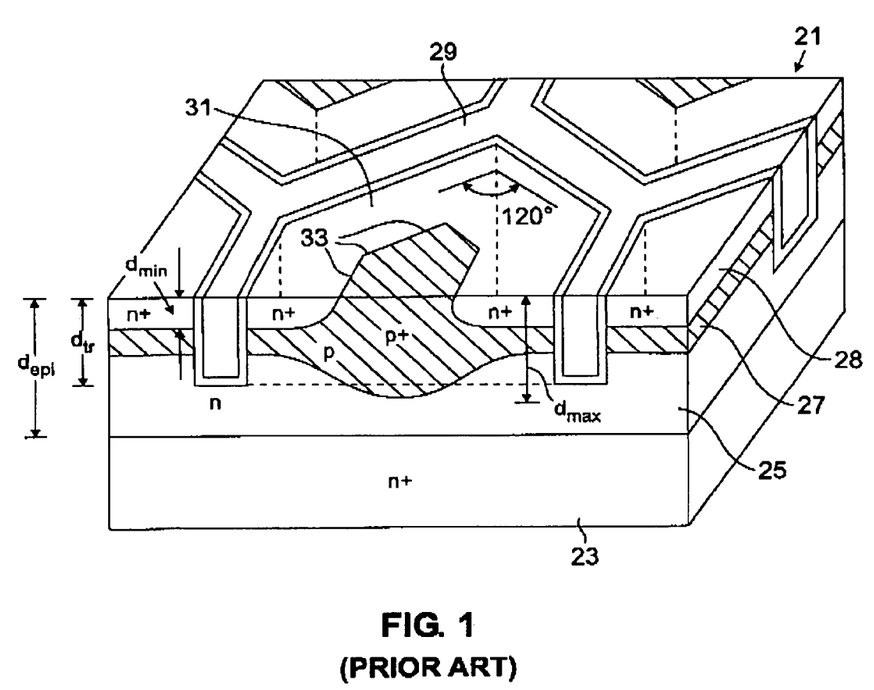
FIG. 1 is a schematic cross-sectional view of a trench MOSFET device in the prior art.

As a specific example, FIG. 1 illustrates half of a hexagonally shaped trench MOSFET structure 21 disclosed in U.S. Pat. No. 5,072,266. The structure includes an n+ substrate 23, upon which is grown a lightly doped n epitaxial layer 25 of a predetermined depth $d_{epi}$. Within the epitaxial layer 25, p body region 27 (p, p+) is provided. In the design shown, the p body region 27 is substantially planar (except in a central region) and typically lays a distance $d_{min}$ below the top surface of the epitaxial layer. Another layer 28 (n+) overlying most of the p body region 27 serves as source for the device. A series of hexagonally shaped trenches 29 are provided in the epitaxial layer, opening toward the top and having a predetermined depth $d_{tr}$. The trenches 29 are typically lined with oxide and filled with conductive polysilicon, forming the gate for the MOSFET device. The trenches 29 define cell regions 31 that are also hexagonally shaped in horizontal cross-section. Within the cell region 31, the p body region 27 rises to the top surface of the epitaxial layer and forms an exposed pattern 33 in a horizontal cross section at the top surface of the cell region 31. In the specific design illustrated, the p+ central portion of the p body region 27 extends to a depth $d_{max}$ below the surface of the epitaxial layer that is greater than the trench depth $d_{tr}$ for the transistor cell so that breakdown voltage is away from the trench surface and into the bulk of the semiconductor material.

A typical MOSFET device includes numerous individual MOSFET cells that are fabricated in parallel within a single chip (i.e., a section of a semiconductor wafer). Hence, the chip shown in FIG. 1 contains numerous hexagonal-shaped cells 31 (portions of five of these cells are illustrated). Cell configurations other than hexagonal configurations are commonly used, including square-shaped configurations. In a design like that shown in FIG. 1, the substrate region 23 acts as a common drain contact for all of the individual MOSFET cells 31. Although not illustrated, all the sources for the MOSFET cells 31 are typically shorted together via a metal source contact that is disposed on top of the n+ source regions 28. An insulating region, such as borophosphosilicate glass (not shown) is typically placed between the polysilicon in the trenches 29 and the metal source contact to prevent the gate regions from being shorted with the source regions. Consequently, to make gate contact, the polysilicon within the trenches 29 is typically extended into a termination region beyond the MOSFET cells 31, where a metal gate contact is provided on the polysilicon. Since the polysilicon gate regions are interconnected with one another via the trenches, this arrangement provides a single gate contact for all the gate regions of the device. As a result of this scheme, even though the chip contains a matrix of individual transistor cells 31, these cells 31 behave as a single large transistor.

Demand persists for trench MOSFET devices having ever-lower on-resistance. One way to reduce on-resistance is to increase cell density. Unfortunately, the gate charges associated with trench MOSFET devices also increase when cell density is increased. As a result, steps need to be taken to reduce such gate charges. As noted in JP05335582, the oxide film at the trench sidewall of a trench MOSFET device forms the channel within the P-body region. The oxide film at the bottom of the trench, on the other hand, does not contribute significantly to channel formation, but nonetheless contributes to gate charges. The inventors in JP05335582 propose thickening the oxide film at the bottom of the trench substantially relative to the oxide film at the sidewall to reduce gate charges.

A related way to reduce the gate charge contribution of the trench bottoms is to provide narrower trenches, as is known in the art. The present invention provides a novel process for the formation of narrow trenches within a semiconductor substrate.

SUMMARY OF THE INVENTION

According to an embodiment of the invention, a method of forming a trench within a semiconductor substrate is provided. The method comprises: (a) providing a semiconductor substrate; (b) providing a patterned first CVD-deposited masking material layer having a first aperture over the semiconductor substrate; (c) depositing a second CVD-deposited masking material layer over the first masking material layer; (d) etching the second masking material layer until a second aperture that is narrower than the first aperture is created in the second masking material within the first aperture; and (e) etching the semiconductor substrate through the second aperture such that a trench is formed in the semiconductor substrate.

The first and second masking material layers are preferably of the same material composition (typically silicon oxide layers) and are preferably etched in anisotropic, dry oxide etching processes.

The substrate is preferably a silicon substrate and is preferably etched in an anisotropic, reactive ion etching process.

The first trench mask aperture can range, for example, from 0.4 to 0.8 microns across in smallest dimension, while the second trench mask aperture can range, for example, from 0.2 to 0.6 microns across in smallest dimension.

Preferably, the patterned first masking material layer is provided over the semiconductor substrate by a method comprising: (a) providing a first masking material layer over the semiconductor substrate; (b) applying a patterned photoresist layer (preferably a positive photoresist layer) over the first masking material layer; and (c) etching the first masking material layer through an aperture in the patterned photoresist layer such that the first aperture is formed in the first masking material layer.

The method of the present invention is useful in forming trench MOSFET devices. According to one embodiment of the invention, a trench MOSFET device is formed by a method comprising: (a) providing a semiconductor wafer of first conductivity type; (b) depositing an epitaxial layer of first conductivity type over the wafer, the epitaxial layer having a lower majority carrier concentration than the wafer; (c) forming a body region of second conductivity type within an upper portion of the epitaxial layer; (d) providing a patterned first masking material layer over the epitaxial layer, the patterned first masking material layer comprising a first aperture; (d) depositing a second masking material layer over the first masking material layer; (e) etching the second masking material layer until a second aperture that is narrower than the first aperture is created in the second masking material layer within the first aperture; (f) forming a trench in the epitaxial layer by etching the semiconductor wafer through the second aperture; (g) forming an insulating layer lining at least a portion of the trench; (h) forming a conductive region within the trench adjacent the insulating layer; and (i) forming a source region of first conductivity type within an upper portion of the body region and adjacent the trench. Preferably, the semiconductor wafer and the epitaxial layer are formed from silicon, and the first and second masking material layers are preferably formed from silicon dioxide.

One advantage of the present invention is that trenches with narrow widths can be formed within a semiconductor substrate.

Another advantage of the present invention is that a trench MOSFET device can be formed with narrow trenches, and hence reduced gate charges.

Another advantage of the present invention is that trench masks can be formed having apertures that are smaller than those directly obtainable from photolithographic processing.

These and other embodiments and advantages of the present invention will become immediately apparent to those of ordinary skill in the art upon review of the detailed description and claims to follow.

DETAILED DESCRIPTION OF PREFERRED EMBODIMENTS OF THE INVENTION

The present invention now will be described more fully hereinafter with frequent reference to the accompanying drawings, in which preferred embodiments of the present invention are shown. This invention may, however, be embodied in different forms and should not be construed as limited to the embodiments set forth herein.

Figure 2A:
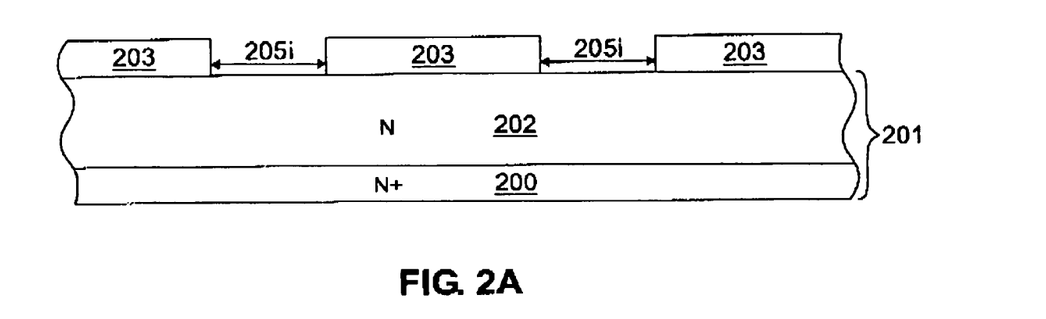
FIGS. 2A through 2D are schematic cross-sectional views illustrating a process for forming a narrow trench, according to an embodiment of the present invention.
Figure 2B:
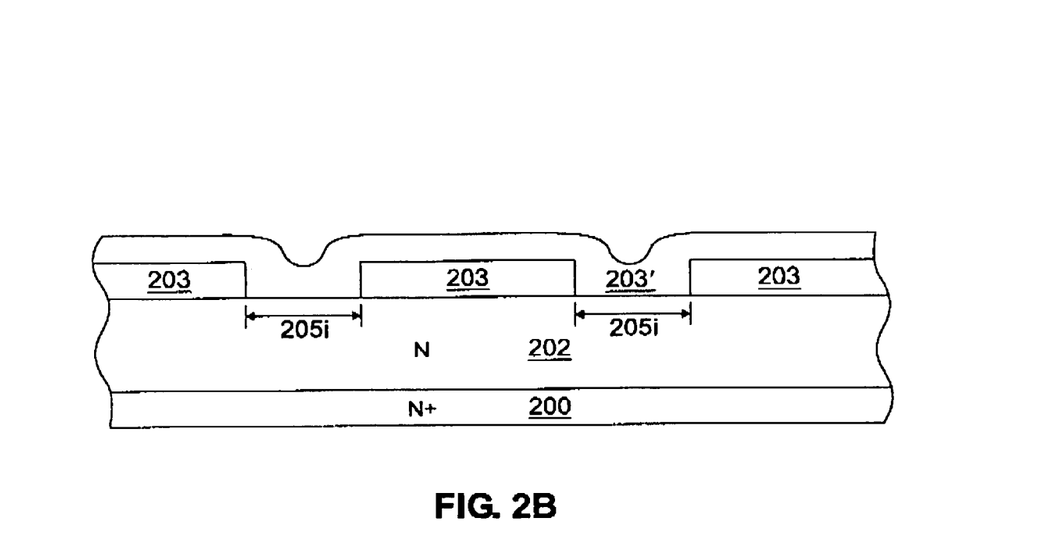

According to an embodiment of the present invention, a semiconductor substrate is the preferred substrate. The semiconductor substrate can be any such substrate known in the art, including elemental semiconductor substrates, such as silicon or germanium, or compound semiconductor substrates, such as GaAs, AlAs, GaP, InP, GaAlAs, and so forth. The semiconductor substrate can be single crystal, polycrystalline and/or amorphous, and it can be doped or undoped. A specific example of a semiconductor substrate is presented in connection with FIGS. 2A through 2D. Referring to FIG. 2A, a silicon semiconductor substrate 201 is shown, which consists of an N+ doped silicon wafer 200 having an N doped silicon epitaxial layer 202 disposed thereon.

Once the substrate is selected, a first layer of a masking material that is appropriate for forming a trench mask is provided on the substrate and patterned using any appropriate technique known in the art. For example, a first masking material layer can be provided on the substrate, and an appropriately patterned photoresist layer can then be provided over the first masking material layer, followed by etching under conditions that etch the masking material but do not substantially etch the photoresist material (and also preferably do not substantially etch the substrate beneath the masking material). After this etching step, the first layer of masking material contains one or more first mask apertures. Preferred materials for the masking material include CVD deposited materials, such as nitrides (e.g., silicon nitride) and oxides (e.g., silicon dioxide).

Referring again to the specific example of FIGS. 2A–2D for purposes of illustration, a patterned first masking material layer 203 of a silicon oxide (typically silicon dioxide) with initial apertures 205i is formed on the epitaxial layer 202 as seen in FIG. 2A. A preferred technique for providing such as patterned first mask oxide layer 203 is as follows: first, a silicon dioxide layer is provided by depositing a non-doped silica glass (NSG) layer using techniques well known in the art. The deposition of such a layer is typically followed by a high-temperature annealing step, during which step the silicon dioxide layer is densified. A patterned layer of photoresist material, such as a positive photoresist material, is then provided over the resulting first mask oxide layer (i.e., the densified NSG layer). Subsequently, the oxide layer is anisotropically etched through apertures in the patterned layer of photoresist material using a dry oxide etch as is known in the art, producing a patterned first mask oxide layer 203 with initial apertures 205i. Using well-established 0.5-micron semiconductor technology, for example, this step typically results in minimum reproducible initial apertures 205i of about 0.4 microns.

As a next step, an additional layer of masking material is provided over the patterned first masking material layer. This additional layer is then etched, typically under conditions similar to those used to etch the apertures in the first layer of masking material, until portions of the semiconductor substrate are exposed within the initial mask apertures. At the same time, unetched portions of the additional masking material layer remain within the initial trench mask apertures adjacent the sidewalls of the same. These remaining portions are referred to herein as "sidewall spacers".

Figure 2C:
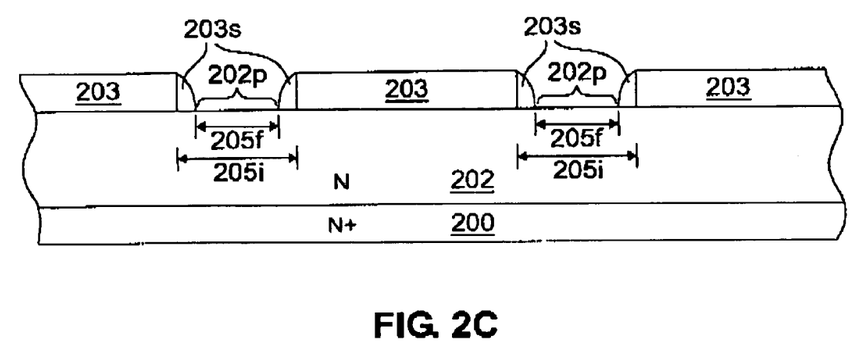

Referring back to FIGS. 2A–2D as a specific example, a further layer of NSG is deposited over the patterned first mask oxide layer 203 of FIG. 2A, followed by densification, to form an additional mask oxide layer 203'. This mask oxide layer 203' is then anisotropically etched, for example by using a dry oxide etch, until portions 202p of the epitaxial layer 202 are exposed, along with upper portions of the patterned first mask oxide layer 203, as shown in FIG. 2C. This etching process leaves behind sidewall spacer portions 203s, formed from the additional mask oxide layer 203', which are adjacent to the sidewalls of the initial apertures 205i. In this way, a "two-component" masking layer consisting of both the patterned first mask oxide layer 203 and sidewall spacers 203p is formed. This two-component masking layer contains final apertures 205f that are substantially narrower than the initial apertures 205i. In the case where initial apertures 205i are provided at the limit of the photolithographic technology available, the present invention provides a way of creating final mask apertures 205f that are beyond this limit. Using 0.5-micron technology as an example, final mask apertures 205f of about 0.2 microns can be produced.

Figure 3A:
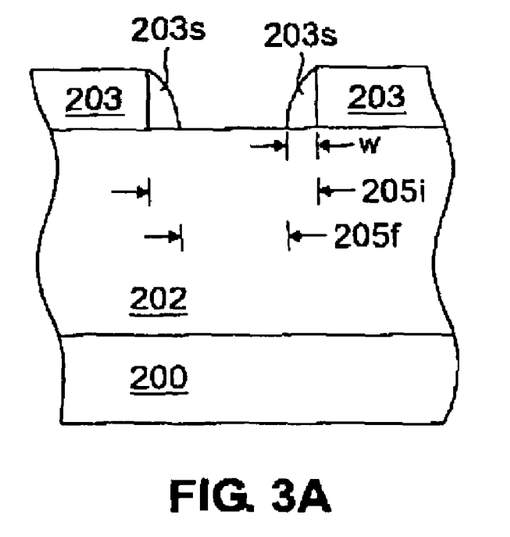
FIGS. 3A and 3B are schematic cross-sectional views illustrating a method of increasing sidewall spacer width, according to an embodiment of the present invention.
Figure 3B:
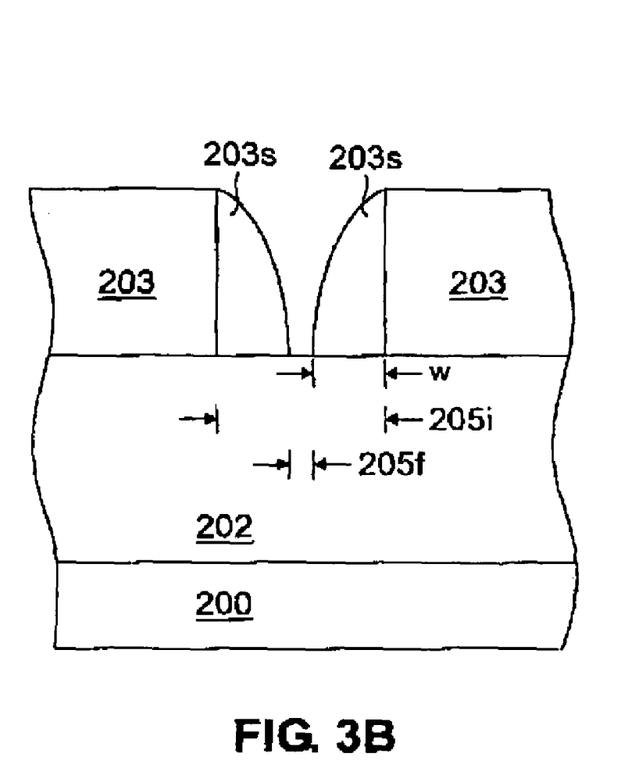

An embodiment of the present invention in which the widths of the sidewall spacers 203s (and consequently the dimension of the final aperture 205f) can be varied will now be discussed. In this embodiment, the widths of the sidewall spacers 203 are increased by increasing the thickness of the patterned first mask oxide layer 203. This effect is illustrated in FIGS. 3A and 3B in which two initial trench mask apertures 205i of the same width are produced within patterned mask oxide layers 203. Subsequently, an additional layer of masking material is provided and etched as described above, producing sidewall spacers 203s. The patterned mask oxide layer 203 in FIG. 3A is substantially thinner than the patterned mask oxide layer 203 in FIG. 3B. Under these circumstances, and because the profiles of the sidewall spacers 203s are relatively similar (from a geometric standpoint) in shape, the widths w of the sidewall spacers in FIG. 3A are substantially smaller (and hence the apertures 205f are substantially larger) than those in FIG. 3B.

Once the two-component trench mask is formed in accordance with the present invention, the semiconductor substrate is etched through the final apertures in the mask using an etching process by which the semiconductor material is selectively etched relative to the trench mask.

Figure 2D:
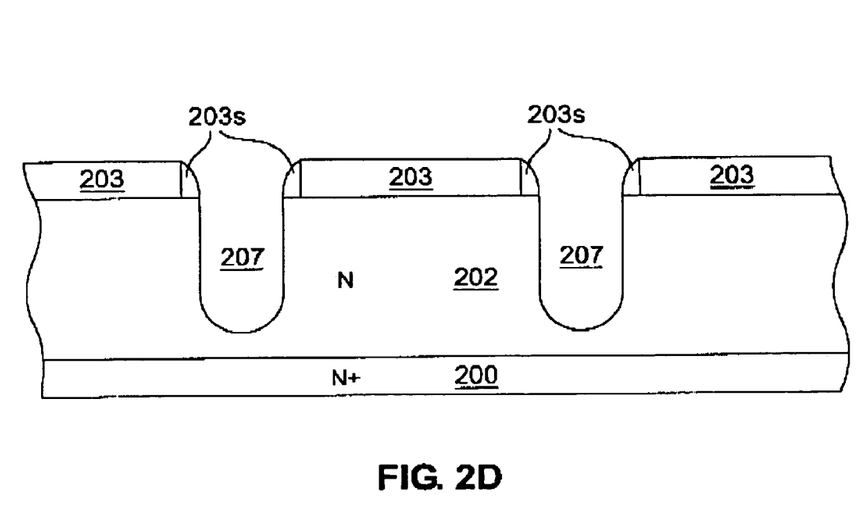

Referring once again to the specific example of FIGS. 2A–2D, the silicon epitaxial layer 202 is anisotropically etched, for example by reactive ion etching, through the final apertures 205f in the two-component oxide mask (which includes both the patterned first mask oxide layer 203 and the sidewall spacers 203s), resulting in trenches 207 as shown in FIG. 2D. The widths of the trenches 207 reflect the final apertures 205f, rather than the initial apertures 205i.

As noted above, narrow trench widths are useful in connection with trench MOSFET devices in that the gate-drain charges associated with such devices are reduced, among other effects. A method of forming a typical trench MOSFET device that incorporates the two-component trench mask of the present invention is briefly discussed here in connection with FIGS. 4A–4C.

Figure 4A:
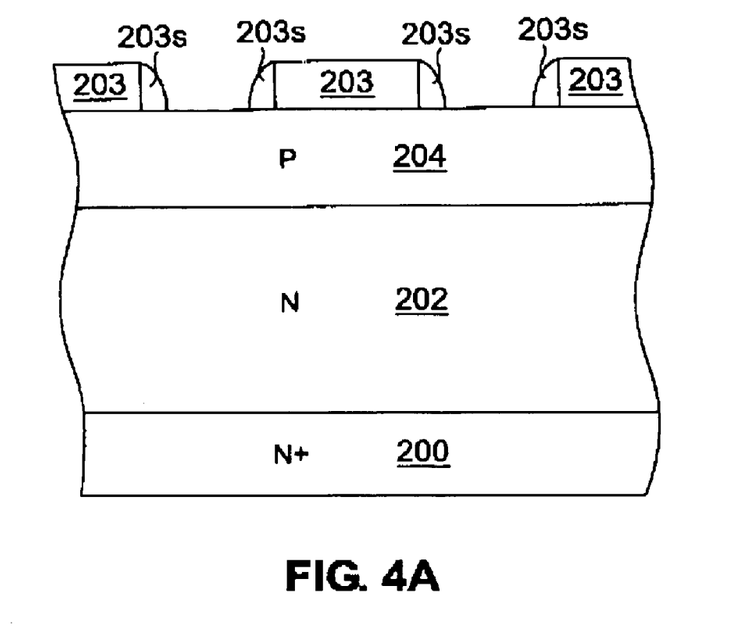
FIGS. 4A through 4C are schematic cross-sectional views illustrating a method of making a trench MOSFET device, according to an embodiment of the present invention.

Turning now to FIG. 4A, an N doped epitaxial layer 202 is initially grown on an N+ doped substrate 200. A P-type region 204 is then formed in upper portion of the epitaxial layer 202 by implantation and diffusion. Subsequently, a two-component trench mask including both a patterned mask oxide layer 203 and oxide sidewall spacer portions 203s is formed as discussed above in connection with FIGS. 2A–2C. The resulting structure is shown in FIG. 4A.

Figure 4B:
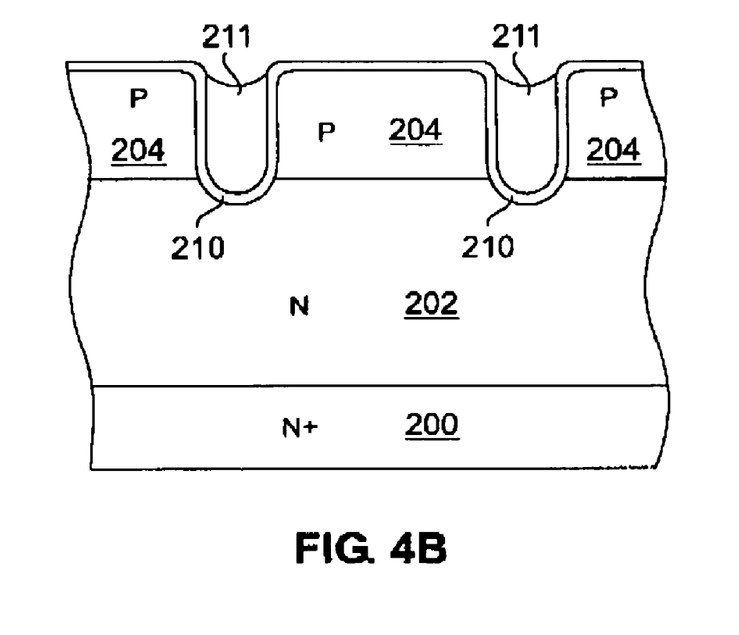

Trenches are then etched as discussed in connection with FIG. 2D above. Discrete P-type regions 204 are established as a result of this trench-forming step. The two-component trench mask is then removed and an oxide layer 210 is grown over the surface of the device, typically by dry oxidation at elevated temperature. Portions of the oxide layer 210 ultimately form the gate oxide regions for the finished device. The surface of the structure is then covered, and the trenches are filled, with a polysilicon layer, typically using CVD. The polysilicon is typically doped N-type to reduce its resistivity. The polysilicon layer is then etched, forming polysilicon gate regions 211. The resulting structure is shown in FIG. 4B.

Figure 4C:
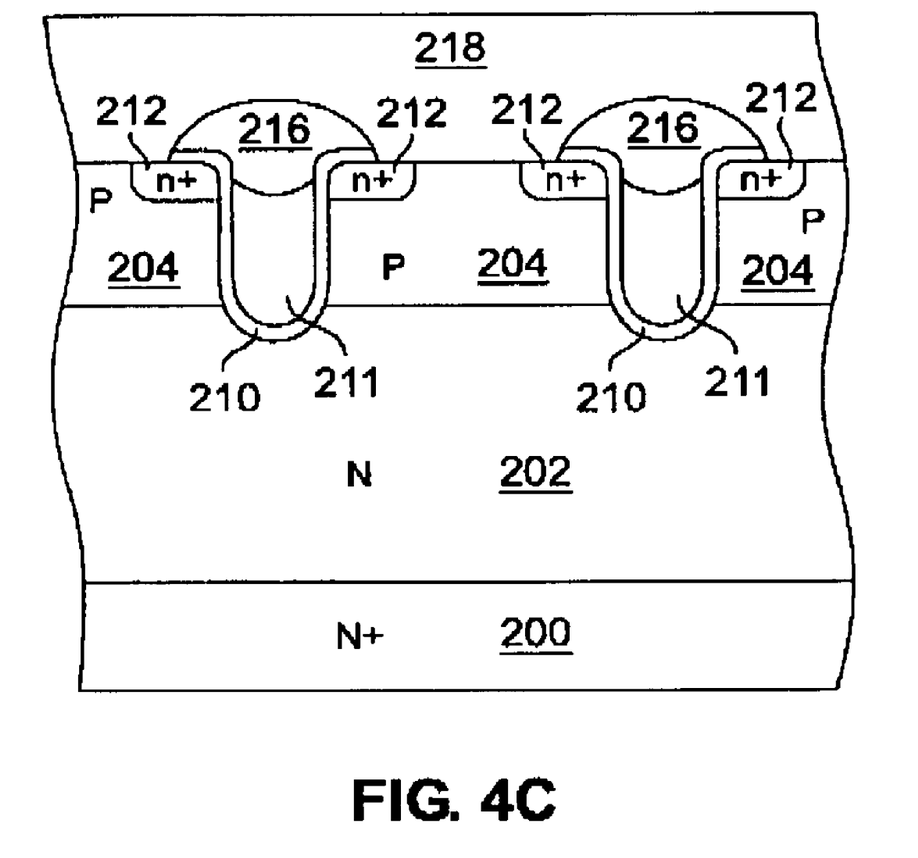

Subsequently, n+ source regions 212 are formed in upper portions of the epitaxial layer via an implantation and diffusion process. BPSG (borophosphosilicate glass) regions 216 are then formed, typically by deposition, masking and etching processes, covering polysilicon regions 211 and a portion of the oxide regions 210. Finally, a metal contact layer (e.g., aluminum) is deposited, forming source contact 218. The resulting structure is shown in FIG. 4C. A separate metal gate contact is also typically connected to a gate runner portion of the polysilicon that is located outside of the cell region of the trench MOSFET (not shown). Furthermore, a metal drain contact is also typically provided in connection with the semiconductor substrate (not shown).

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A method of forming a trench MOSFET comprising:
   providing a semiconductor wafer of a first conductivity type;
   depositing an epitaxial layer of said first conductivity type over said wafer, said epitaxial layer having a lower majority carrier concentration than said wafer;
   forming a body region of a second conductivity type within an upper portion of said epitaxial layer;
   providing a patterned first masking material layer over said epitaxial layer, said patterned first masking material layer comprising a densified non-doped silica glass layer overlaid by a positive photoresist material, and said patterned first masking material layer comprising a first aperture;
   depositing a second masking material layer over said first masking material layer, said second masking material layer comprising a densified non-doped silica glass layer;
   etching said second masking material layer until a second aperture is created in said second masking material layer within said first aperture, said second aperture being narrower than said first aperture;
   forming a trench in said epitaxial layer by etching said semiconductor wafer through said second aperture; and
   removing the first masking material layer and the second masking material layer prior to performing the following steps:
   forming an insulating layer lining at least a portion of said trench;
   forming a conductive region within said trench adjacent said insulating layer; and
   forming a source region of said first conductivity type within an upper portion of said body region and adjacent said trench,
   wherein said step of forming a source region is performed subsequent to said step of forming a trench.

2. The method of claim 1 wherein said patterned first masking material layer is provided over said semiconductor wafer by a method comprising:
   providing a first masking material layer over said epitaxial layer;
   applying a patterned photoresist layer over said first masking material layer; and etching said first masking material layer through an aperture in said patterned photoresist layer such that said first aperture is formed in said first masking material layer.

3. The method of claim 1, wherein said semiconductor wafer is a silicon wafer and said epitaxial layer is a silicon epitaxial layer.

4. The method of claim 1, wherein said first and second masking material layers are of the same material composition.

5. The method of claim 1, wherein said first and second masking material layers are silicon dioxide layers.

6. The method of claim 1, wherein said process of etching said second masking material is an anisotropic, dry oxide etching process.

7. The method of claim 1, wherein said process of etching said semiconductor is an anisotropic, reactive ion etching process.

8. The method of claim 2, wherein said photoresist layer is a positive resist layer.

9. The method of claim 2, wherein said processes of etching said first and second masking material layers are anisotropic, dry oxide etching processes.

10. The method of claim 1, wherein said first trench mask aperture ranges from 0.4 to 0.8 microns in smallest dimension and said second trench mask aperture ranges from 0.2 to 0.6 microns in smallest dimension.

* * * * *

UNITED STATES PATENT AND TRADEMARK OFFICE
CERTIFICATE OF CORRECTION

PATENT NO. : 6,977,203 B2
APPLICATION NO. : 10/010162
DATED : December 20, 2005
INVENTOR(S) : Fwu-Iuan Hshieh et al.

It is certified that error appears in the above-identified patent and that said Letters Patent is hereby corrected as shown below:

Col. 3, line 12, after "aperture;", change "(d)" to --(e)--.

Col. 3, line 13, after "layer;", change "(e)" to --(f)--.

Col. 3, line 16, after "aperture;", change "(f)" to --(g)--.

Col. 3, line 18, after "aperture;", change "(g)" to --(h)--.

Col. 3, line 19, after "trench;", change "(h)" to --(i)--.

Col. 3, line 21, after "and", change "(i)" to --(j)--.

Col. 5, line 2, after "203", change "*p*" to --*s*--.

Col. 7, line 11, Claim 5, after "claim", change "1" to --3--.

Signed and Sealed this

Second Day of January, 2007

JON W. DUDAS
*Director of the United States Patent and Trademark Office*